(12) United States Patent
Zhu et al.

(10) Patent No.: US 12,721,157 B2
(45) Date of Patent: Aug. 25, 2026

(54) DIE INTERCONNECT STRUCTURE WITH EMBEDDED INDUCTOR(S) INCLUDING COUPLED COILS FORMED IN REDISTRIBUTION LAYER (RDL) AND ADJACENT BUMP-LEVEL DISTRIBUTION LAYER (BDL) FOR IMPROVED Q FACTOR

(71) Applicant: QUALCOMM Incorporated, San Diego, CA (US)

(72) Inventors: John Jianhong Zhu, San Diego, CA (US); Junjing Bao, San Diego, CA (US); Abhishek Jain, San Diego, CA (US); Giridhar Nallapati, San Diego, CA (US)

(73) Assignee: QUALCOMM Incorproated, San Diego, CA (US)

( * ) Notice: Subject to any disclaimer, the term of this patent is extended or adjusted under 35 U.S.C. 154(b) by 367 days.

(21) Appl. No.: 18/591,876

(22) Filed: Feb. 29, 2024

(65) Prior Publication Data

US 2025/0279354 A1 Sep. 4, 2025

(51) Int. Cl.

| | |
|---|---|
| ***H10W 20/40*** | (2026.01) |
| ***H10W 44/20*** | (2026.01) |
| ***H10W 70/685*** | (2026.01) |
| ***H10W 90/00*** | (2026.01) |

(52) U.S. Cl.

CPC ......... *H10W 20/497* (2026.01); *H10W 44/20* (2026.01); *H10W 70/685* (2026.01); *H10W 90/00* (2026.01); *H10W 90/701* (2026.01); *H10W 44/209* (2026.01); *H10W 44/248* (2026.01); *H10W 90/722* (2026.01); *H10W 90/724* (2026.01); *H10W 90/794* (2026.01); *H10W 90/798* (2026.01)

(58) Field of Classification Search

None

See application file for complete search history.

(56) References Cited

U.S. PATENT DOCUMENTS

2013/0032923 A1* 2/2013 Lin .......................... H10D 1/20 257/E21.022

* cited by examiner

*Primary Examiner* — Kyoung Lee

(74) *Attorney, Agent, or Firm* — W & T

(57) ABSTRACT

Aspects disclosed herein include a die interconnect structure with embedded inductor(s) including coupled coils formed in redistribution layer (RDL) and adjacent bump-level distribution layer (BDL) for improved Q factor. The die interconnect structure includes a metal pad and a first coil formed in the RDL. The die interconnect structure also includes the BDL which includes a secondary metal pad and a second coil. The die interconnect structure also includes a seed layer between the first coil and the second coil. The die interconnect structure includes an inductor comprising the first coil, the second coil, and a via coupling the first and second coils. In this manner, the additional second coil formed in the BDL has higher conductance, less resistance than a coil formed in metallization layers within the die and, thus, advantageously improving the Q factor of the inductor.

20 Claims, 11 Drawing Sheets

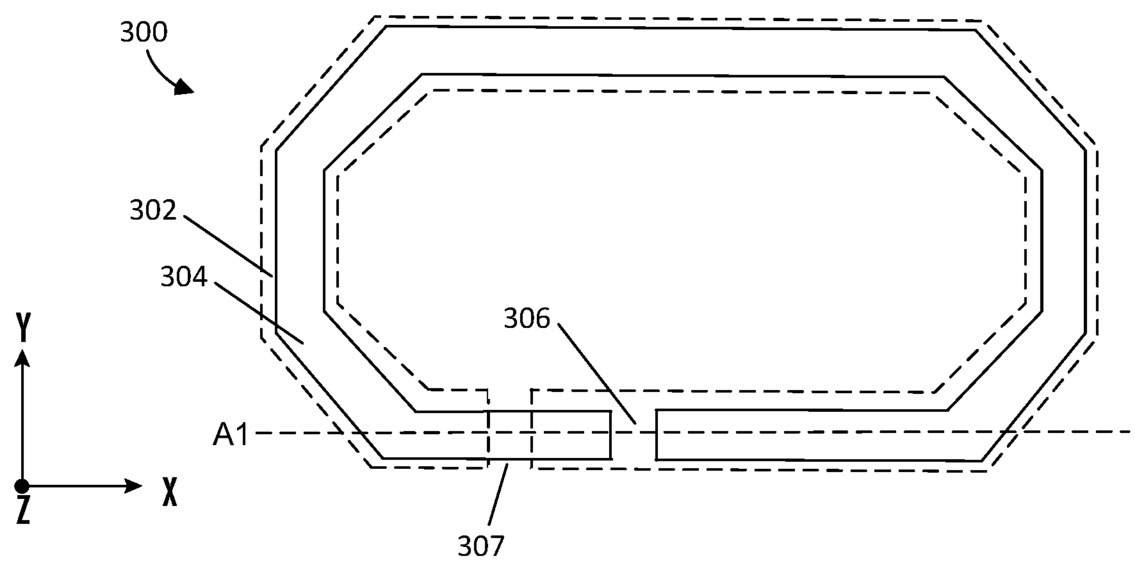
FIG. 3A
304
312
306
310
304
308
320
322
302
316
307
318
324
302
326
Z
X
Y
FIG. 3B
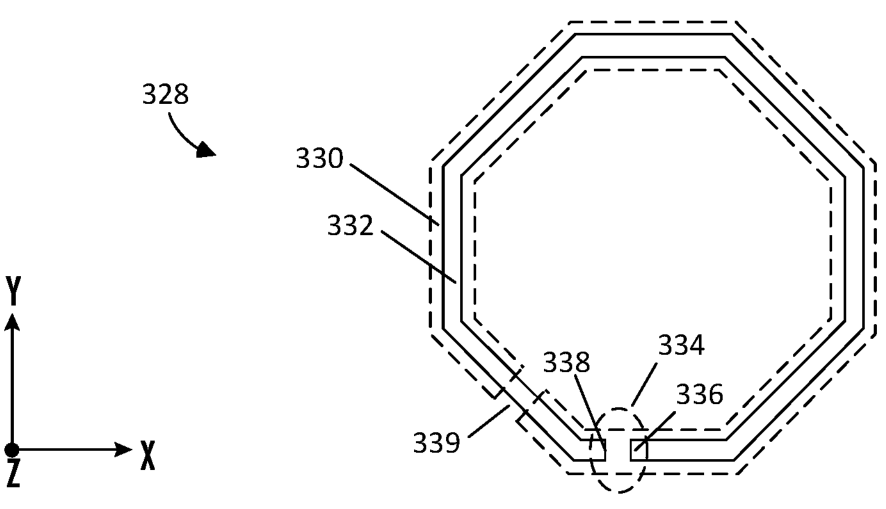
FIG. 3C 322
214
306
212
214
212
600G
224

X
Z
Y
322
610
214
212
214
212
600H
224

X
Z
Y
From FIG. 5B
514
REMOVING THE PORTION OF THE SEED LAYER (224 IN THE GAP (306)
516
DEPOSITING A PASSIVATION LAYER (610) OVER THE DIE (108(1))

DIE INTERCONNECT STRUCTURE WITH EMBEDDED INDUCTOR(S) INCLUDING COUPLED COILS FORMED IN REDISTRIBUTION LAYER (RDL) AND ADJACENT BUMP-LEVEL DISTRIBUTION LAYER (BDL) FOR IMPROVED Q FACTOR

BACKGROUND

I. Field of the Disclosure

The field of the disclosure relates to integrated circuit (IC) packages that include one or more semiconductor dies ("dies") attached to a package substrate, and more particularly to inductors formed in a die interconnect structure on a die(s).

II. Background

Integrated circuits (ICs) are the cornerstone of electronic devices. ICs are packaged in an IC package, also called a "semiconductor package" or "chip package." The IC package includes one or more semiconductor dice ("dies" or "dice") as an IC(s) that is mounted on and electrically coupled to a package substrate to provide physical support and an electrical interface to the die(s). The package substrate also includes one or more metallization layers that include metal interconnects (e.g., metal traces, metal lines) with vertical interconnect accesses (vias) coupling the metal interconnects together between adjacent metallization layers to provide electrical interfaces between the die(s). The package substrate also includes an outer metallization layer that includes metal interconnects coupled to external metal interconnects (e.g., ball grid array (BGA) interconnects) to provide an external interface between the die(s) in the IC package. The external metal interconnects can also be coupled (e.g., soldered) to traces in a printed circuit board (PCB) to attach the package to the PCB and interface its die(s) with the circuitry of the PCB.

The die(s) also includes one or more metallization layers that include metal interconnects (e.g., metal traces, metal lines). An outer metallization layer, also known as a redistribution layer (RDL), includes metal interconnects (e.g., metal pads, metal traces, and metal lines). The die(s) also includes die interconnects (e.g., balls or pillars) which electrically couple the metal interconnects in the die(s) to the metal interconnects exposed in the outer metallization layer of the package substrate. Inductors are typically formed in the one or more metallization layers in the die.

A Q factor characterizes the performance of an inductor at a given frequency and is defined as the ratio of the inductive reactance to the series resistance of the inductor. A higher Q factor indicates a lower rate of energy loss and a more efficient performance of the inductor. The Q factor is calculated using the formula $Q=R\omega/L$, where Lis the inductance, R is the DC resistance, and $\omega L$ is the inductive reactance. Lowering the resistance of the inductor improves its Q factor and narrows its bandwidth, leading to better performance. Unwanted resistance in an inductor can be due to factors such as standard DC resistance, skin effect, radiated energy, and core losses. Therefore, to improve the Q factor of an inductor on a semiconductor, it is important to minimize these resistance factors and optimize the inductive reactance. However, increasing conductance (i.e., 1/R) and thus increasing a Q factor can be challenging in IC package designs given the limited number and widths of metallization layers formed within a die or in the RDL of the die.

SUMMARY

Aspects disclosed in the detailed description include a die interconnect structure with embedded inductor(s) including coupled coils formed in a redistribution layer (RDL) and adjacent bump-level distribution layer (BDL) for improved Q factor. Related integrated circuit (IC) packages and fabrication methods are also disclosed. The die interconnect structure formed on a die includes the RDL which includes a metal pad and a first coil. The RDL could be a back-end-of-line (BEOL) interconnect structure of a semiconductor die as an example. The die interconnect structure also includes the BDL which includes a secondary metal pad and a second coil. The BDL is a metallization layer which is as thick or thicker than the RDL. The die interconnect structure also includes a seed layer between the first coil and the second coil and is used in depositing the BDL during fabrication and, in particular, forming the die interconnect and second coil. The BDL may be manufactured at a semiconductor and test (SAT) facility. The die interconnect structure includes an inductor comprising the first coil, the second coil, and a via coupling the first and second coils. Rather than be limited to the number of metallization layers in the die and their smaller thickness than the BDL, the additional second coil is also formed in the same thick BDL containing the die interconnects and is coupled to the first coil formed in the RDL through a via. In this manner, the additional second coil formed in the thick BDL has higher conductance and less resistance than a coil formed in metallization layers within the die and, thus, advantageously improving the Q factor of the inductor.

In this regard in one aspect, a die interconnect structure formed on a die comprises a first surface. The die interconnect structure comprises a RDL extending in a first direction adjacent to the first surface and having a second surface. The RDL comprises a first coil extending in the first direction. The die interconnect structure further comprises a BDL extending in the first direction. The BDL comprises a second coil. The die interconnect structure further comprises a seed layer extending in the first direction adjacent to the second surface of the RDL, the seed layer between the first coil and the second coil. The die interconnect structure further comprises an inductor. The inductor comprises the first coil, the second coil, and a via extending in a second direction orthogonal to the first direction, the via coupling the first coil to the second coil.

In another aspect, a method for forming a die interconnect structure formed on a die comprising a first surface is disclosed. The method comprises depositing a RDL extending in a first direction adjacent to the first surface and having a second surface. Depositing the RDL comprises forming a first coil extending in the first direction. The method further comprises depositing a seed layer extending in the first direction adjacent to the second surface of the RDL and depositing a BDL extending in the first direction. Depositing the BDL further comprises forming a second coil, the seed layer between the first coil and the second coil. The method further comprises forming an inductor. Forming the inductor comprises forming a via extending in a second direction orthogonal to the first direction, the via coupling the first coil to the second coil.

BRIEF DESCRIPTION OF THE DRAWINGS

FIG. 3A is top view of an exemplary embedded inductor including coupled coils formed in a RDL and adjacent BDL for improved Q factor;

FIG. 3B is a cross-sectional side view of the embedded inductor along cut line A1 in FIG. 3A illustrating a via which couples the coils of the embedded inductor in FIG. 3A;

FIG. 3C is top view of another exemplary embedded inductor including coupled coils formed in the RDL and adjacent BDL for improved Q factor;

DETAILED DESCRIPTION

Figure 1:
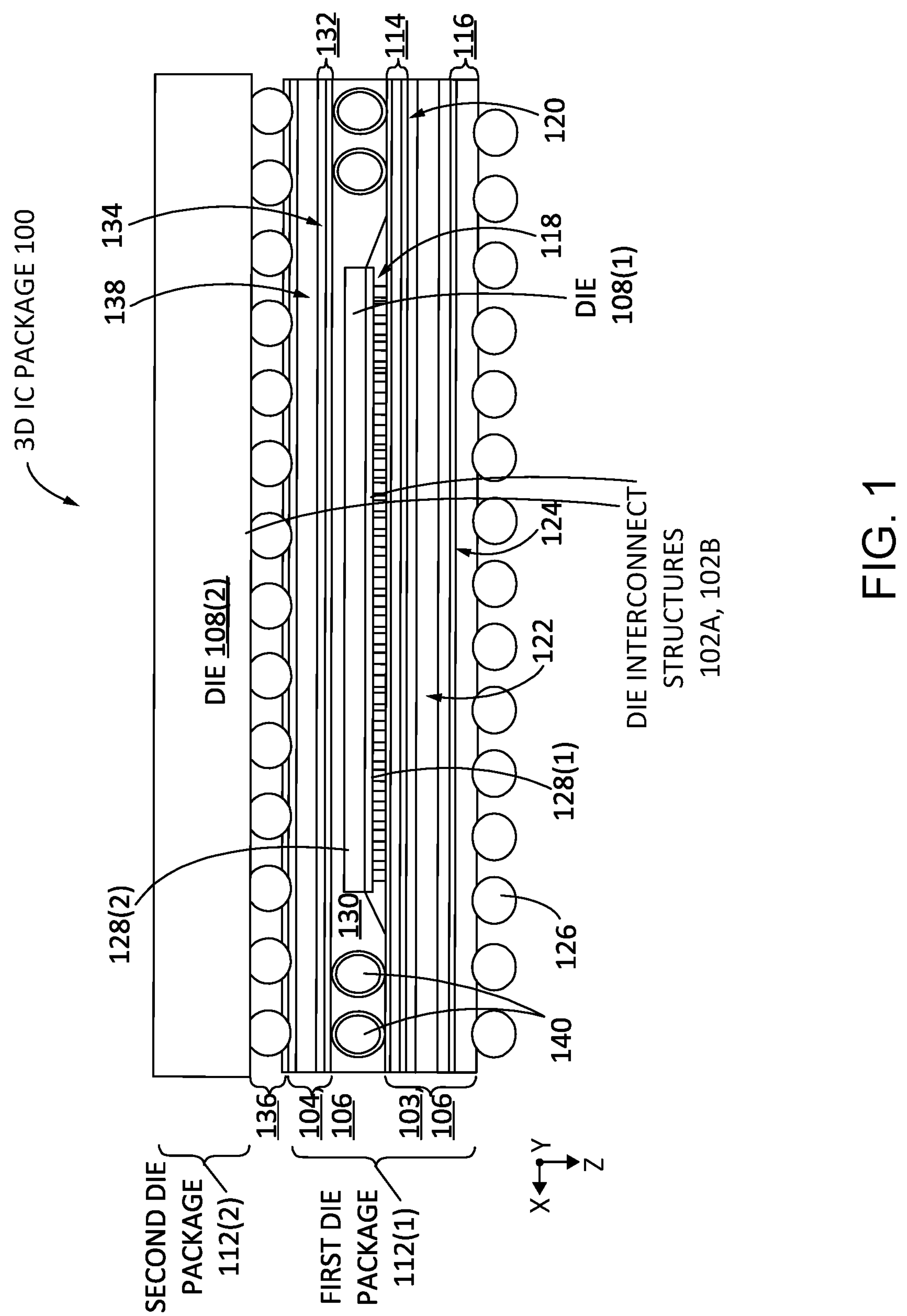
FIG. 1 is a cross-sectional side view of an exemplary IC package that includes a die interconnect structure with an embedded inductor including coupled coils formed in a redistribution layer (RDL) and adjacent bump-level distribution layer (BDL) for improved Q factor.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects. The term "adjacent" as used herein means spatially next to but not necessarily adjoining something as shown in the Figures unless specifically stated otherwise.

Aspects disclosed in the detailed description include a die interconnect structure with embedded inductor(s) including coupled coils formed in a redistribution layer (RDL) and adjacent bump-level distribution layer (BDL) for improved Q factor. Related integrated circuit (IC) packages and fabrication methods are also disclosed. The die interconnect structure formed on a die includes the RDL which includes a metal pad and a first coil. The RDL could be a back-end-of-line (BEOL) interconnect structure of a semiconductor die as an example. The die interconnect structure also includes the BDL which includes a secondary metal pad and a second coil. The BDL is a metallization layer which is as thick or thicker than the RDL. The die interconnect structure also includes a seed layer between the first coil and the second coil and is used in depositing the BDL during fabrication and, in particular, forming the die interconnect and second coil. The BDL may be manufactured at a semiconductor and test (SAT) facility. The die interconnect structure includes an inductor comprising the first coil, the second coil, and a via coupling the first and second coils. Rather than be limited to the number of metallization layers in the die and their smaller thickness than the BDL, the additional second coil is also formed in the same thick BDL containing the die interconnects and is coupled to the first coil formed in the RDL through a via. In this manner, the additional second coil formed in the thick BDL has higher conductance and less resistance than a coil formed in metallization layers within the die and, thus, advantageously improving the Q factor of the inductor.

In this regard, FIG. 1 is a cross-sectional side view of an exemplary IC package 100 that includes a die interconnect structure with an embedded inductor including coupled coils formed in a redistribution layer (RDL) and adjacent bump-level distribution layer (BDL) for improved Q factor. In this example, the exemplary IC package 100 is a three-dimensional (3D) integrated circuit (IC) (3DIC) package 100 that includes die interconnect structures 102A-102B with an embedded inductor including coupled coils formed in a RDL and adjacent BDL for improved Q factor. The IC package 100 includes a package substrate 103 and an interposer substrate 104. The package substrate 103 and the interposer substrate 104 commonly route signals and power and, for convenience, may both be referred to simply as a substrate 106.

In this example, the IC package 100 includes first and second dies 108(1), 108(2) that are included in respective first and second die packages 112(1), 112(2) that are stacked on top of each other in the vertical direction (Z-axis direction). The first die package 112(1) of the IC package 100 includes the first die 108(1) coupled to the package substrate 103. In this example, the package substrate 103 includes a first, upper and outer metallization layer 114. The first, upper and outer metallization layer 114 provides an electrical interface for signal routing to the first die 10(1). The first die 108(1) is coupled to die interconnects 118 (e.g., raised metal bumps, pillars) that are electrically coupled to metal interconnects 120 in the first, upper and outer metallization layer 114. The first die 108(1) includes the die interconnect structure 102A which couples the die interconnects 118 to the circuitry within the first die 108(1) and includes an embedded inductor with a coil formed in the RDL and coupled to an adjacent coil formed in the BDL. The interconnect structures 102A-102B will be discussed in more detail in connection with FIGS. 2A-2D. The metal interconnects 120 in the first, upper metallization layer 114 are coupled to metal vias 122 (not visible) in the package substrate 103, which are coupled to metal interconnects 124 in a second, bottom and outer metallization layer 116. In this manner, the package substrate 103 provides interconnections between its first and second metallization layers 114 and 116 to provide signal routing to the first die 108(1). Both the first and second metallization layers 114 and 116 will contain a die interconnect structures 102A and 102B, respectively, and will be discussed in more detail in connection with FIGS. 3A-3D. External interconnects 126 (e.g., ball grid array (BGA) interconnects, a.k.a. bumps) are coupled to the metal interconnects 124 in the second, bottom and outer metallization layer 116 to provide interconnections through the package substrate 103 to the first die 108(1) through the die interconnects 118. In this example, a first, active side 128(1) of the first die 108(1) is adjacent to and coupled to the package substrate 103, and more specifically the first, upper and outer metallization layer 114 of the package substrate 103.

In the exemplary IC package 100 in FIG. 1, an additional optional second die package 112(2) is provided and coupled to the first die package 112(1) to support multiple dies. For example, the first die 108(1) in the first die package 112(1) may include an application processor, and the second die 108(2) may be a memory die, such as a dynamic random access memory (DRAM) die that provides memory support for the application processor. In this regard, in this example, the first die package 112(1) also includes the interposer substrate 104 that is disposed on a package mold 130 encasing the first die 108(1), adjacent to a second, inactive side 128(2) of the first die 108(1). The interposer substrate 104 also includes one or more metallization layers 132 that each include metal interconnects 134 to provide interconnections to the second die 108(2) in the second die package 112(2). The second die package 112(2) is physically and electrically coupled to the first die package 112(1) by being coupled through external interconnects 136 (e.g., solder bumps, BGA interconnects) to the interposer substrate 104. The external interconnects 136 are coupled to the metal interconnects 134 in the interposer substrate 104 through metal vias 138 (not visible). The first die package 112(1) includes vertical interconnects 140 to couple the second die 108(2) to the external interconnects 126 and to the first die 108(1) through the package substrate 103. The second die 108(2) also includes a die interconnect structure, die interconnect structure 102B which couples the external interconnects 136 to the circuitry within the second die 108(2) and includes and includes an embedded inductor with a coil formed in the RDL and coupled to an adjacent coil formed in the BDL. The die interconnect structures 102A-102B will be discussed in more detail in connection with FIGS. 2A-2C.

Figure 2A:
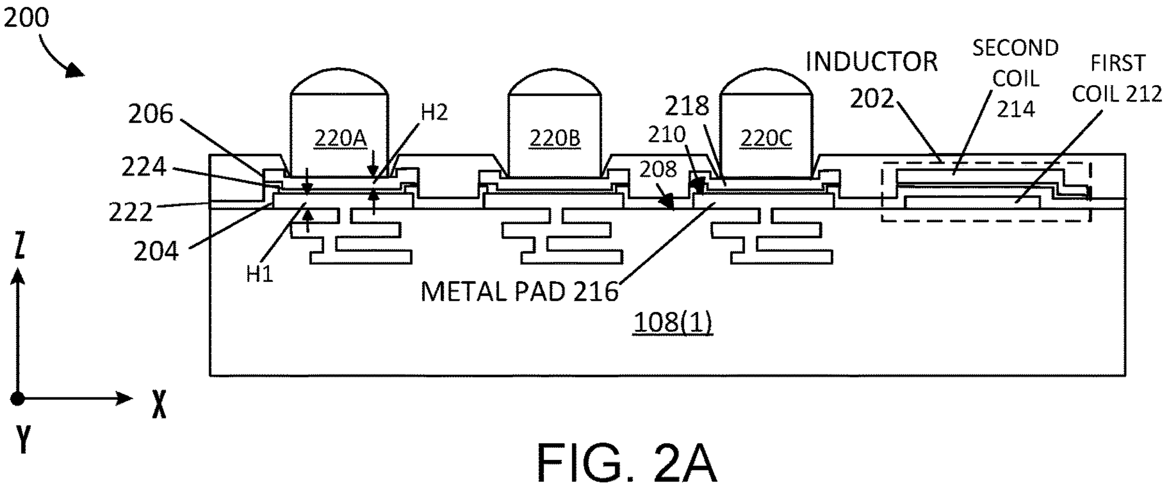
FIG. 2A is a close-up cross-sectional side view of a die shown in FIG. 1 having an exemplary die interconnect structure with an embedded inductor including coupled coils formed in a RDL and adjacent BDL for improved Q factor.
Figure 2B:
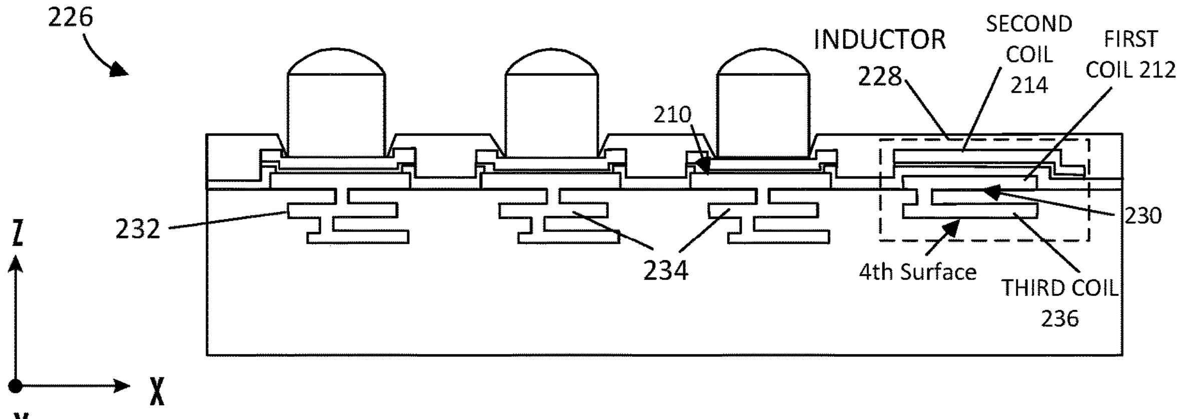
FIG. 2B is a close-up view of another exemplary die interconnect structure with an embedded inductor including coupled coils formed in the RDL and adjacent BDL for improved Q factor.
Figure 2C:
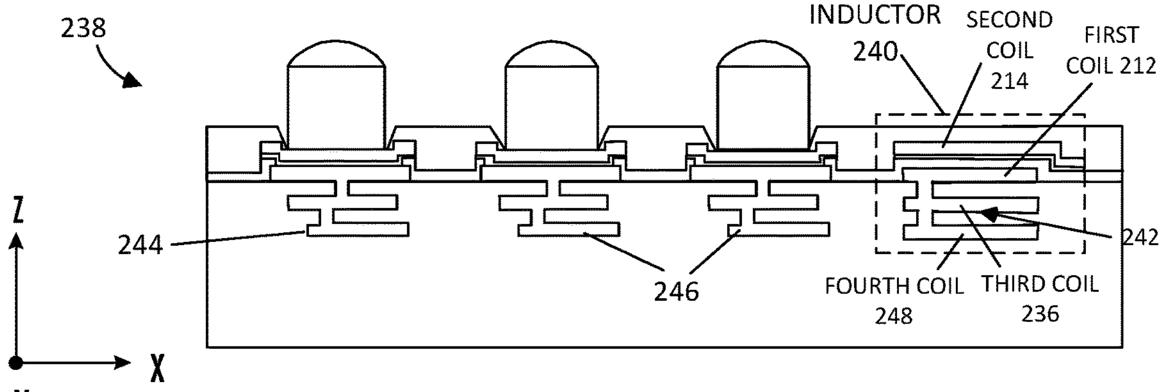
FIG. 2C is a close-up view of another exemplary die interconnect structure with an embedded inductor including coupled coils formed in the RDL and adjacent BDL for improved Q factor.

FIGS. 2A-2C illustrate three exemplary die interconnect structures with an embedded inductor. FIG. 2A is a close-up cross-sectional side view of a die shown in FIG. 1, such as the die 108(1) or the die 108(2), having an exemplary die interconnect structure 200 with an embedded inductor 202 including coupled coils formed in a RDL 204 and an adjacent BDL 206 for improved Q factor. The BDL 206 is a metallization layer that may be manufactured at various widths. Preferably, the width of the BDL 206 in the vertical, Z-axis direction is as wide as the RDL 204 in the vertical, Z-axis direction.

For this example, the die 108(1) is shown rotated 180° from the way the die 108(1) is shown FIG. 1. The die 108(1) includes a first surface 208. The exemplary die interconnect structure 200 includes the RDL 204 extending in a first, horizontal direction (X-, Y-axes direction) and a second surface 210. The RDL 204 includes a first coil 212 extending in the first, horizontal direction. The RDL 204 includes metal pad(s) 216 and traces not shown. The BDL 206 also extends in the first, horizontal direction and includes a second coil 214. The BDL 206 includes secondary metal pad(s) 218 adjacent to the metal pad(s) 216 upon which die interconnects 220A-220C (e.g., Cu pillars, posts, and the like) are supported. The die interconnect structure 200 includes a dielectric layer 222 (e.g., also known as a passivation layer) extending in the first, horizontal direction and is directly adjacent to the first surface 208 of the die 108(1) and the first coil 212. The dielectric layer 222 protects the die 108(1) before fabricating the secondary metal pad(s) 218 and die interconnects 220A-220C since the fabrication of the secondary metal pad(s) 218 and die interconnects 220A-220C may be done at a different fabrication facility than the one that fabricated the die 108(1). The dielectric layer 222 also insulates the first coil 212 from the second coil 214. The height H1 in the vertical direction (Z-axis) of the RDL 204 is approximately 2 μm and the height H2 of the BDL 206 in the vertical direction (Z-axis) can be in the range of 2-10 μm, inclusively.

The die interconnect structure 200 also includes a seed layer 224 composing of Ti/Cu and extending in the first, horizontal direction adjacent the second surface 210 of the RDL 204 which coincides with the same surface of the metal pad(s) 216 and the same surface of the first coil 212. The seed layer 224 also is adjacent to the second coil 214 and is utilized to fabricate the secondary metal pad(s) 218 and the second coil 214 as will be discussed in connection with FIGS. 4 and 6A-6C. The portion of the seed layer 224 under the secondary metal pad(s) 218 is known as under bump metal. In both respects, the seed layer 224 is between the RDL 204 and the BDL 206 and, thus, between the first coil 212 and the second coil 214. The embedded inductor 202 includes the first coil 212 and the second coil 214 and a via extending in a second, vertical direction (Z-axis direction) orthogonal to the first direction. The via couples the first coil to the second coil and will be discussed in connection with FIGS. 3A-3B.

Inductance is proportional to the area enclosed by an inductor's coils times the number of coils. FIGS. 2B and 2C illustrate embedded inductors with additional coils in an exemplary die. FIG. 2B is a close-up view of another exemplary die interconnect structure 226 with an embedded inductor 228 including coupled coils formed in the RDL 204 and the adjacent BDL 206 for improved Q factor. The first coil 212 has a third surface 230 opposite the second surface 210. The die interconnect structure 226 includes a metallization layer 232 extending in the first direction and adjacent to the third surface 230. The metallization layer 232 includes traces 234 and a third coil 236 parallel to the first coil 212.

FIG. 2C is a close-up view of another exemplary die interconnect structure 238 with an embedded inductor 240 including coupled coils formed in the RDL 204 and the adjacent BDL 206 for improved Q factor. The third coil 236 has a fourth surface 242. The die interconnect structure 238 includes a metallization layer 244 extending in the first direction and adjacent to the fourth surface 242. The metallization layer 244 includes traces 246 and a fourth coil 248 parallel to the third coil 236.

FIG. 3A is top view of an exemplary embedded inductor 300, such as the inductors 202, 228, and 240 in FIGS. 2A-2C including coupled coils formed in a RDL and adjacent BDL 206 for improved Q factor. The embedded inductor 300 includes a first coil 302 formed in the RDL 204 (dotted perimeter to reflect that the RDL 204 is a lower plane in the vertical Z-direction) and a second coil 304 formed in the BDL. The second coil 304 is parallel to the first coil 302 and is thinner in the X, Y-axes direction than the first coil 302 and, in other words, is said to be coextensive to the first coil 302. The embedded inductor 300 is in the form of an octagon and the area encompassed by the embedded inductor 300 is approximately 100 square micrometers ($\mu m^2$). The second coil 304 has a gap 306 where the second coil 304 ends and where the second coil 304 couples to the first coil 302 through a via. The first coil 304 has a gap 307.

FIG. 3B is a cross-sectional side view of the embedded inductor 300 along cut line A1 in FIG. 3A illustrating a via 308 which couples the first coil 302 to the second coil 304 in FIG. 3A. The second coil 304 has the gap 306 separating a first end 310 and a second end 312 of the second coil 304. The first coil 302 has a gap 314 separating a first end 316 and a second end 318 of the first coil 302. The via 308 is fabricated on a seed layer 320 deposited on a passivation layer 322 and a portion 324 of the first coil 302. The embedded inductor 300 is provided on a die 326.

Figure 3D:
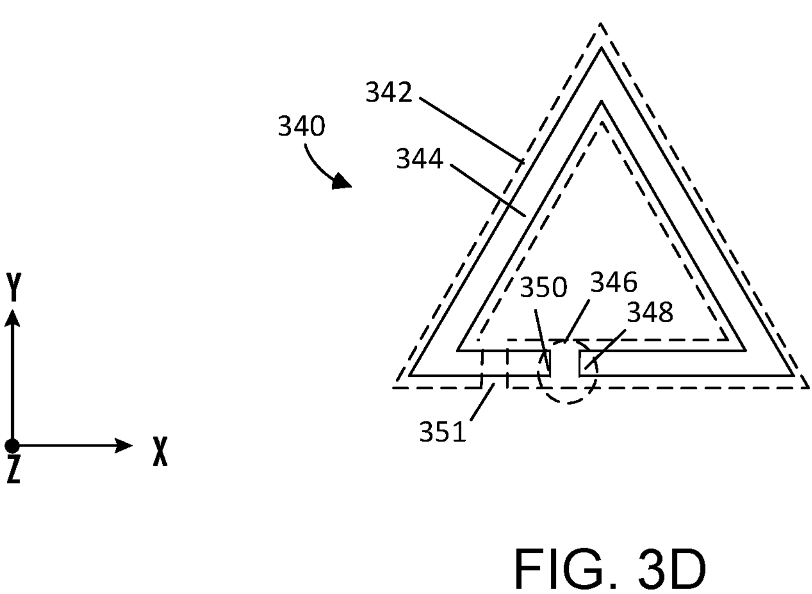
FIG. 3D is top view of another exemplary embedded inductor in the shape of a triangle, the exemplary embedded inductor including coupled coils formed in a RDL and adjacent BDL for improved Q factor.

Embedded inductors which include coupled coils formed in a RDL and adjacent BDL may be formed into various polygons. FIGS. 3C-3F illustrate four exemplary polygons as such an embedded inductor may be fabricated. FIG. 3C is top view of another exemplary embedded inductor 328 including coupled coils formed in a RDL 204 and adjacent BDL 206 for improved Q factor. The embedded inductor 328 includes a first coil 330, a second coil 332 and a gap 334 between a first end 336 and a second end 338 of the second coil 332. The first coil 330 includes a gap 339 between two ends of the first coil 330. The embedded inductor 328 is in the shape of an octagon.

FIG. 3D is top view of another exemplary embedded inductor 340 in the shape of a triangle, the exemplary embedded inductor 340 including coupled coils formed in a RDL 204 and adjacent BDL 206 for improved Q factor. The embedded inductor 340 includes a first coil 342, a second coil 344 and a gap 346 between a first end 348 and a second end 350 of the second coil 344. The first coil 342 includes a gap 351 between two ends of the first coil 342.

Figure 3E:
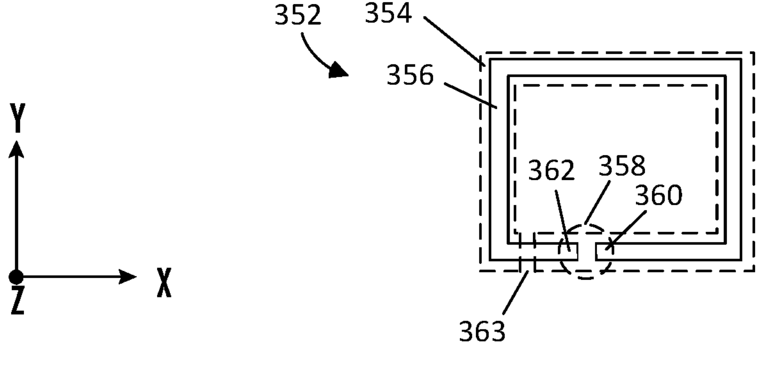
FIG. 3E is top view of another exemplary embedded inductor in the shape of a quadrilateral, the exemplary embedded inductor including coupled coils formed in a RDL and adjacent BDL for improved Q factor.

FIG. 3E is top view of another exemplary embedded inductor 352 in the shape of a quadrilateral, the exemplary embedded inductor 352 including coupled coils formed in a RDL 204 and adjacent BDL 206 for improved Q factor. The embedded inductor 352 includes a first coil 354, a second coil 356 and a gap 358 between a first end 360 and a second end 362 of the second coil 356. The first coil 354 includes a gap 363 between two ends of the first coil 354.

Figure 3F:
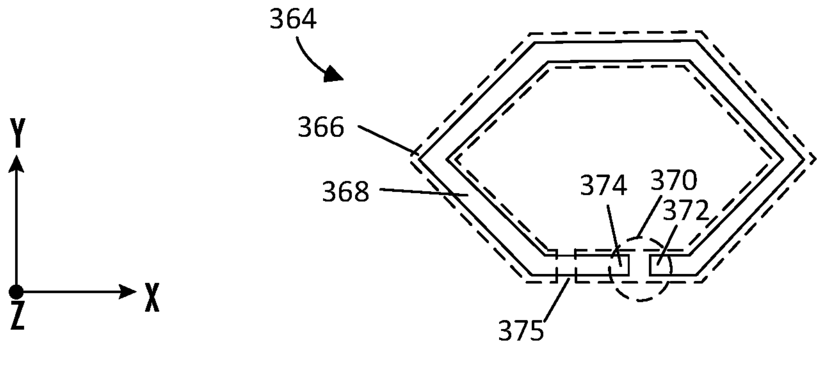
FIG. 3F is top view of another exemplary embedded inductor in the shape of a hexagon, the exemplary embedded inductor including coupled coils formed in a RDL and adjacent BDL for improved Q factor.

FIG. 3F is top view of another exemplary embedded inductor 364 in the shape of a hexagon, the exemplary embedded inductor including coupled coils formed in a RDL 204 and adjacent BDL 206 for improved Q factor. The embedded inductor 364 includes a first coil 366, a second coil 368 and a gap 370 between a first end 372 and a second end 374 of the second coil 368. The first coil 366 includes a gap 375 between two ends of the first coil 366.

Figure 3G:
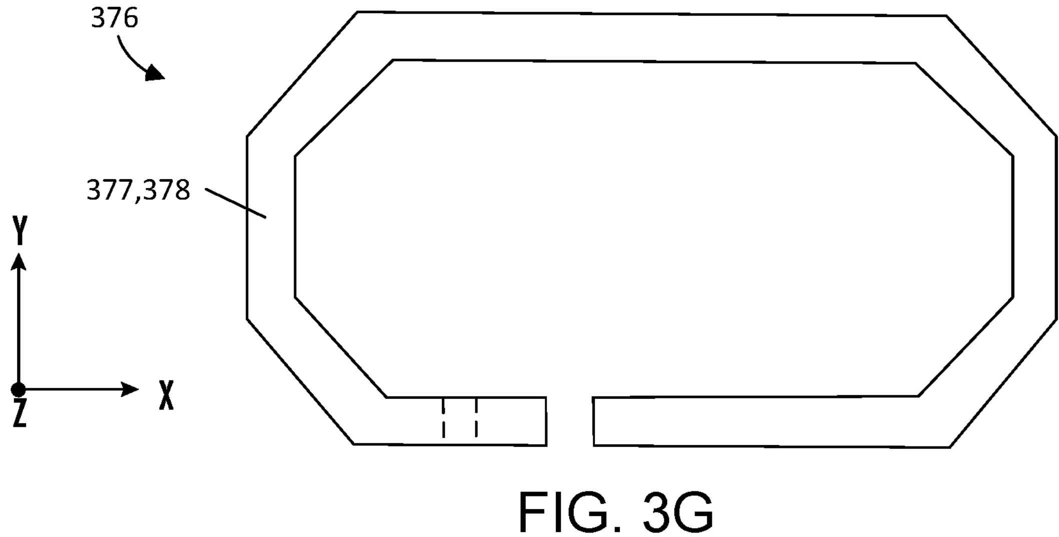
FIG. 3G is top view of another exemplary embedded inductor including coupled coils formed in a RDL and adjacent BDL for improved Q factor, wherein the coil formed in the RDL is coincident with the coil formed in the BDL.
Figure 3H:
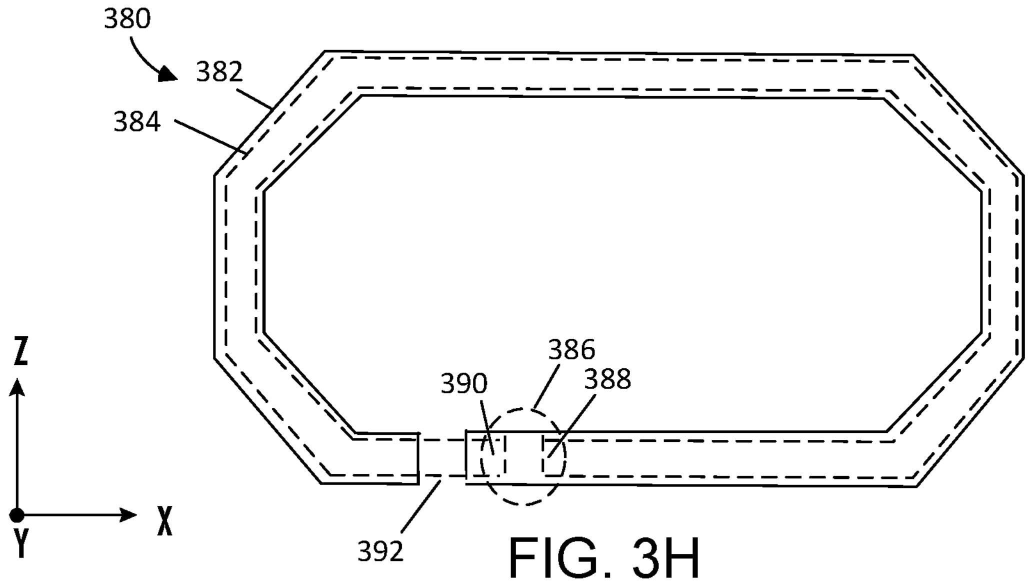
FIG. 3H is top view of another exemplary embedded inductor including coupled coils formed in a RDL and adjacent BDL for improved Q factor, wherein the coil formed in the BDL overlaps the coil formed in the RDL.

FIG. 3A and FIGS. 3C-3F illustrate that the first coil having a width in the first, horizontal direction (X-, Y-axes direction) is wider than the width of the second coil. Although FIG. 3A and FIGS. 3C-3F illustrate the first coil having a width in the first, horizontal direction (X-, Y-axes direction) that is wider than the width of the second coil, the same polygons may be fabricated where the first coil and the second coil having the same widths such that the perimeters of the first and second coils are the same and are said to be coincident. For example, FIG. 3G is top view of another exemplary embedded inductor 376 including coupled coils formed in a RDL 204 and adjacent BDL 206 for improved Q factor, wherein a first coil 377 formed in the RDL 204 is coincident with a second coil 378 formed in the BDL 206 such that perimeter of the first coil is not shown. As shown in FIG. 3G, the first coil 377 formed in the RDL 204 (not shown in FIG. 3G since its borders coincide with the borders of the coil formed in the BDL 378) has the same width in the first, horizontal direction (X-, Y-axes direction) as the second coil 378 formed in the BDL 206. Additionally, the same polygons may be fabricated where the first coil formed in the RDL has a width that is less than the width of the second coil formed in the BDL. For example, FIG. 3H is top view of another exemplary embedded inductor 380 including coupled coils formed in a RDL 204 and adjacent BDL 206 for improved Q factor, wherein the perimeter of the second coil 382 formed in the BDL 206 encompasses the perimeter of the first coil 384 formed in the RDL 204. The embedded inductor 380 also includes a gap 386 between a first end 388 and a second end 390 of the first coil 384 formed in the RDL 204. The second coil 382 includes a gap 392 between two ends of the second coil 382.

Figure 4:
FIG. 4 is a flowchart illustrating an exemplary fabrication process of fabricating a die interconnect structure with an embedded inductor including coupled coils formed in a RDL and adjacent BDL for improved Q factor, including, but not limited to, the exemplary die interconnect structures in FIGS. 2A-2C and embedded inductors in FIGS. 3A-3H.
Figure 4:
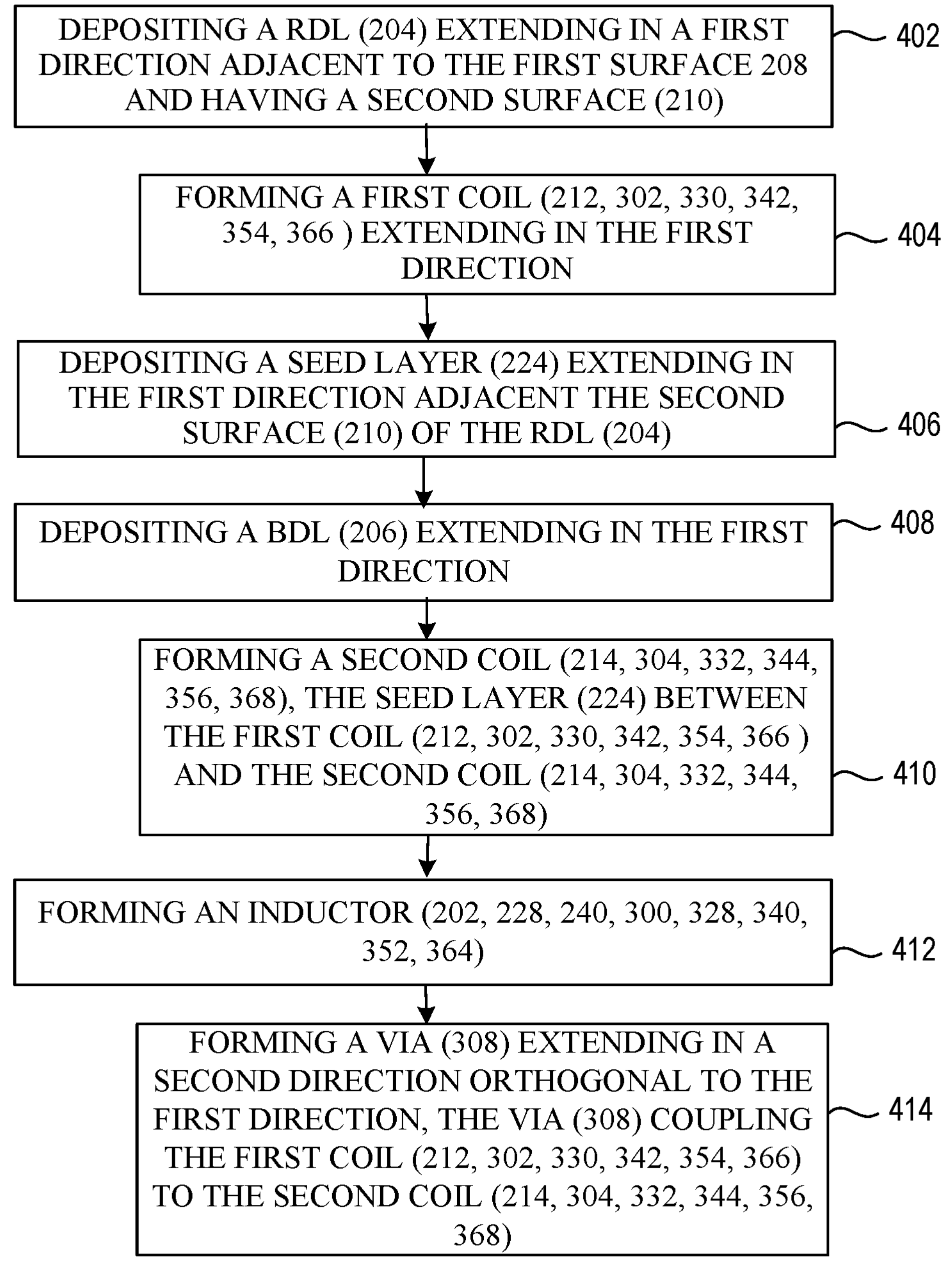

A die interconnect structure with an embedded inductor including coupled coils formed in a RDL and adjacent BDL, including, but not limited to, the embedded inductors 202, 228, 240 in FIGS. 2A-2C and the embedded inductors 300, 328, 340, 352, and 364 in FIGS. 3A-3H in the related IC package 100 in FIG. 1 can be fabricated by different fabrication processes. FIG. 4 is a flowchart illustrating an exemplary fabrication process 400 of fabricating a die interconnect structure with an embedded inductor including coupled coils formed in a RDL and adjacent BDL for improved Q factor, including, but not limited to, the exemplary die interconnect structures in FIGS. 2A-2C and embedded inductors in FIGS. 3A-3H.

In this regard, a first exemplary step for forming a die interconnect structure formed on a die comprising a first surface 208 in the fabrication process 400 of FIG. 4 can include depositing a RDL 204 extending in a first direction adjacent to the first surface 208 and having a second surface 210 (block 402 in FIG. 4). The step of depositing the RDL 204 can include forming a first coil 212, 302, 330, 342, 354, 366 extending in the first direction (block 404 in FIG. 4). The next step in the fabrication process 400 can include depositing a seed layer 224 extending in the first direction adjacent the second surface 210 of the RDL 204 (block 406 in FIG. 4). The next step in the fabrication process 400 can include depositing a BDL 206 extending in the first direction (block 408 in FIG. 4). The step of depositing the BDL 206 can include forming a second coil 214, 304, 332, 344, 356, 368, the seed layer 224 between the first coil 212, 302, 330, 342, 354, 366 and the second coil 214, 304, 332, 344, 356, 368 (block 410 in FIG. 4). The next step in the fabrication process 400 can include forming an inductor 202, 228, 240, 300, 328, 340, 352, 364 (block 412 in FIG. 4). The step of forming an inductor can include forming a via 308 extending in a second direction orthogonal to the first direction, the via 308 coupling the first coil 212, 302, 330, 342, 354, 366 to the second coil 214, 304, 332, 344, 356, 368 (block 414 in FIG. 4).

Figures 5A, 6A, 6B, 6C:
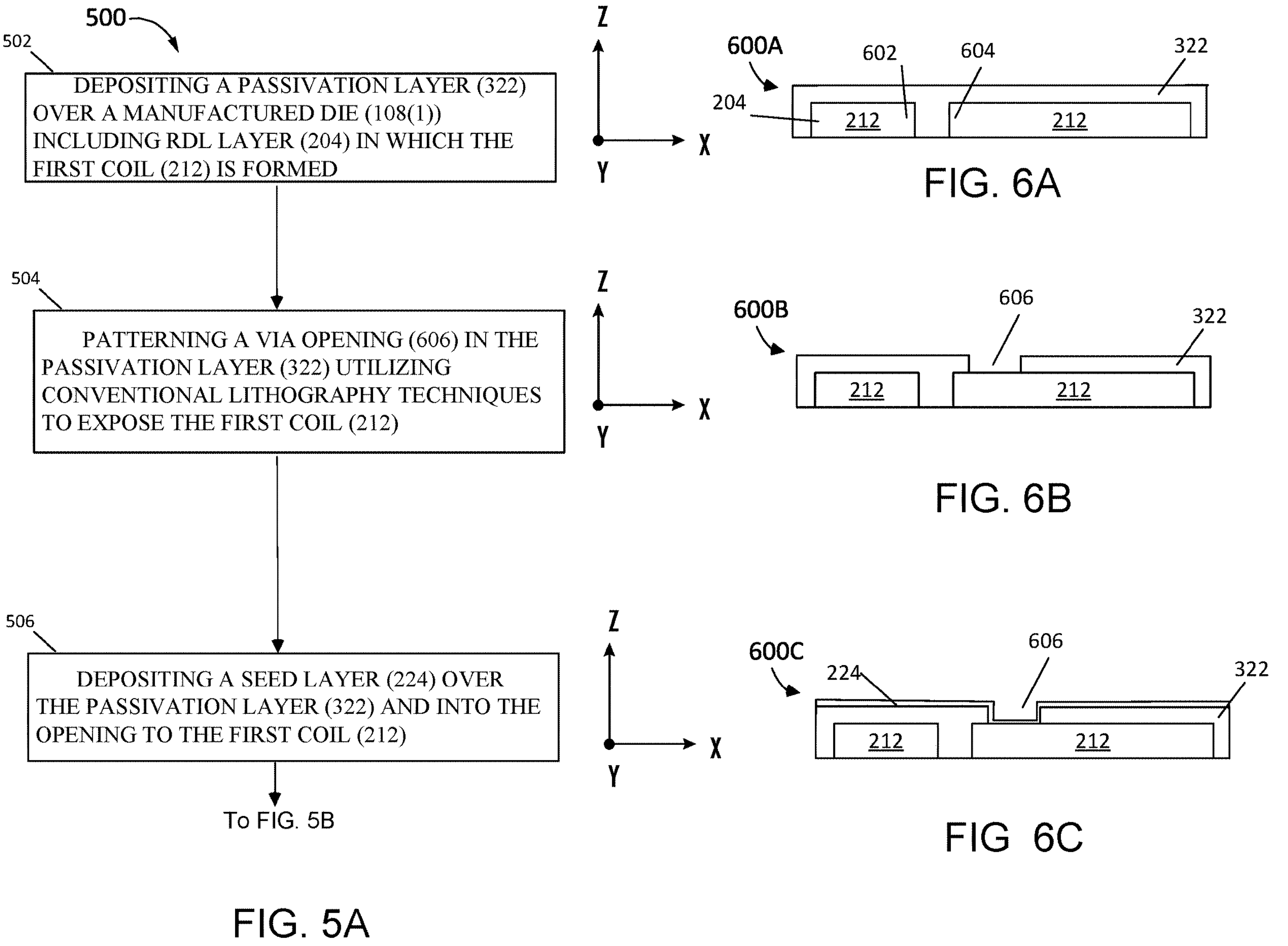
FIGS. 5A-5C is a flowchart illustrating another exemplary fabrication process of fabricating a die interconnect structure with an embedded inductor including coupled coils formed in a RDL and adjacent BDL for improved Q factor, including, but not limited to, the exemplary die interconnect structures in FIGS. 2A-2C and embedded inductors in FIGS. 3A-3H.
FIGS. 6A-6H are exemplary fabrication stages during fabrication of the die interconnect structure according to the fabrication process in FIGS. 6A-6C.
Figures 5B, 6D, 6E, 6F:
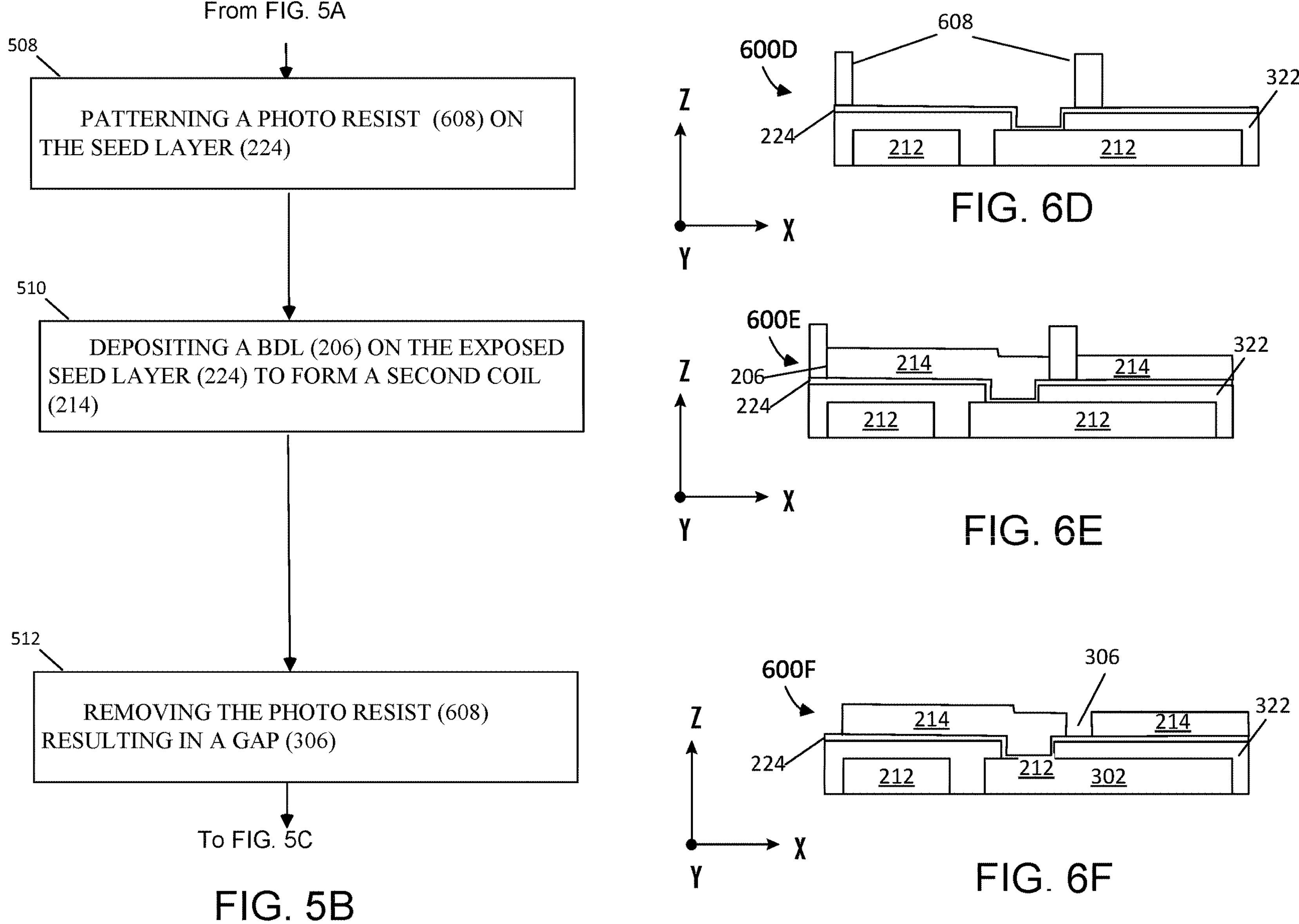
Figures 5C, 6G, 6H:
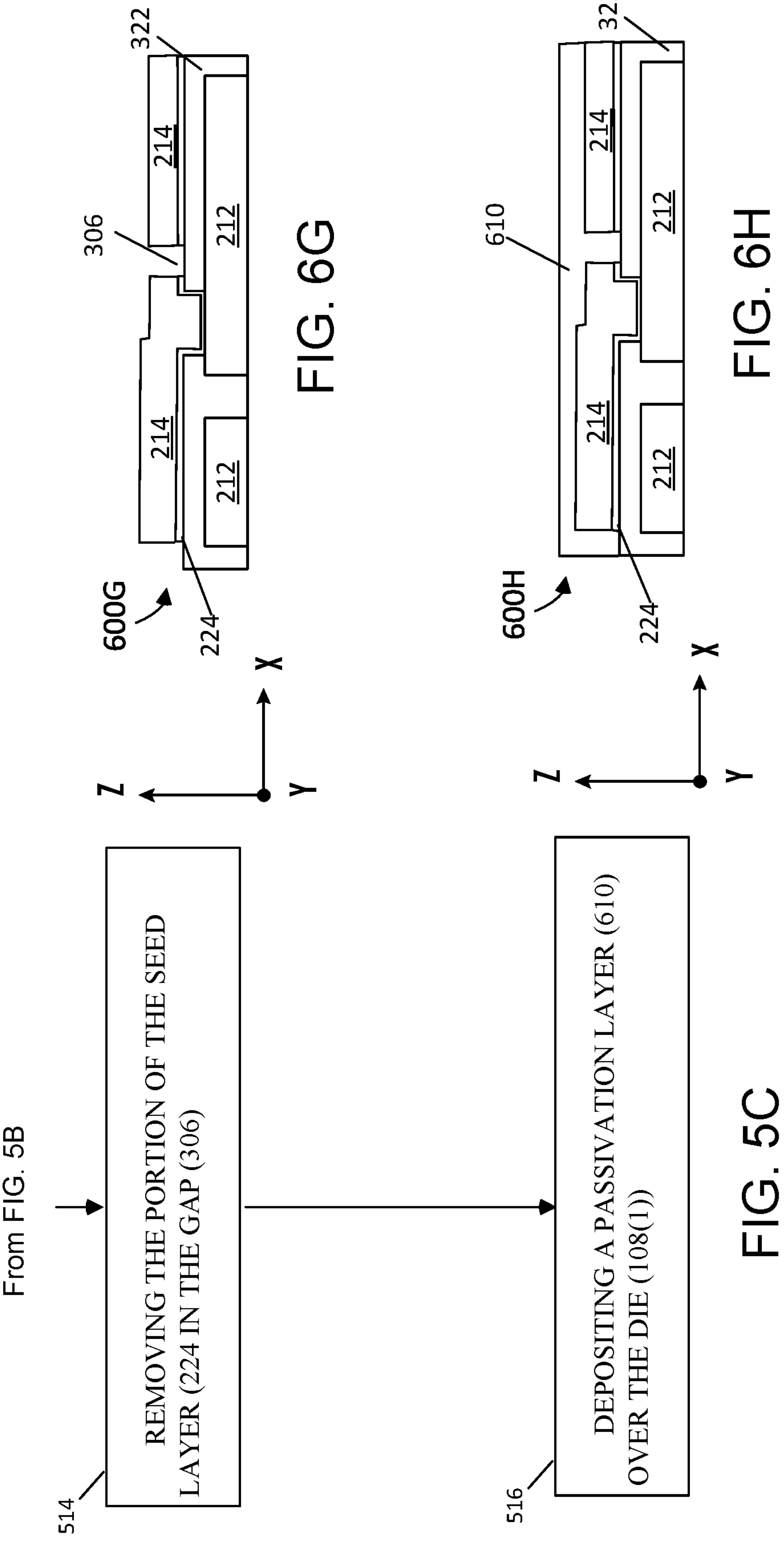

Other fabrication processes can also be employed to fabricate a die interconnect structure with an embedded inductor including coupled coils formed in a RDL and adjacent BDL for improved Q factor, including, but not limited to, the embedded inductors 202, 228, 240, 300, 328, 340, 352, 364 in FIGS. 2A-2C and 3A-3H. In this regard, FIGS. 5A-5C is a flowchart illustrating another exemplary fabrication process 500 of fabricating a die interconnect structure with an embedded inductor including coupled coils formed in a RDL and adjacent BDL for improved Q factor including, but not limited to, the embedded inductors 202, 228, 240, 300, 328, 340, 352, 364 in FIGS. 2A-2C and 3A-3H. FIGS. 6A-6H are exemplary fabrication stages during fabrication of the die interconnect structure according to the fabrication process in FIGS. 5A-5C. The fabrication process 500 as shown in the fabrication stages 600A-600H in FIGS. 6A-6H are in reference to the cross-sectional side view of the embedded inductor 300 along cut line A1 in FIG. 3A, and thus will be discussed with reference to die interconnect structure 200 in FIG. 2A which is deployed on an existing die such as the die 108(1) in the related IC package 100 in FIG. 1 and embedded inductor 300 which is a top-view of die interconnect structure 200.

In this regard, as shown in fabrication stage 600A in FIG. 6A, an exemplary step in the fabrication process 500 is depositing a dielectric layer such as a passivation layer 322 (e.g., SiN) over a manufactured die 108(1) (not shown) including a RDL 204 in which the first coil 212 is formed (block 502 in FIG. 5A). The first coil 212 has a first end 602 and a second end 604. As shown in fabrication stage 600B in FIG. 6B, a next step in the fabrication process 500 can include patterning a via opening 606 in the passivation layer 322 utilizing conventional lithography techniques to expose the first coil 212 (block 504 in FIG. 5A). As shown in fabrication stage 600C in FIG. 6C, a next step in the fabrication process 500 can include depositing a seed layer 224 (e.g., Ti/Cu) over the passivation layer 322 and into the opening to the first coil 212 (block 506 in FIG. 5A). As shown in fabrication stage 600D in FIG. 6D, a next step in the fabrication process 500 can include patterning a photo resist 608 on the seed layer 224 (block 508 in FIG. 5B). As shown in fabrication stage 600E in FIG. 6E, a next step in the fabrication process 500 can include depositing a BDL 206 (e.g., Cu plating process) on the exposed seed layer 224 to form a second coil 214 (block 510 in FIG. 5B). As shown in fabrication stage 600F in FIG. 6F, a next step in the fabrication process 500 can include removing the photo resist 608 (e.g., wet or dry etching process) resulting in a gap 306 (block 512 in FIG. 5B). As shown in fabrication stage 600G in FIG. 6G, a next step in the fabrication process 500 can include removing the portion of the seed layer 224 in the gap 306 (e.g., wet or dry etch process) (block 514 in FIG. 5C). As shown in fabrication stage 600H in FIG. 6H, a next step in the fabrication process 500 can optionally include depositing a passivation layer 610 over the die 108(1) (not shown) (block 516 in FIG. 5C).

Electronic devices that include an IC package, wherein the IC package includes a die interconnect structure with an embedded inductor including coupled coils formed in a RDL and adjacent BDL for improved Q factor, including, but not limited to, inductors including inductors 202, 228, 240 in FIGS. 2A-2C and inductors 300, 328, 340, 352, 364, 376, in FIGS. 3A-3H in the related IC package 100 in FIG. 1, and can be fabricated according to, but not limited to, the exemplary fabrication processes in FIGS. 4 and 5A-5C, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, laptop computer, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, and a multicopter.

Figure 7:
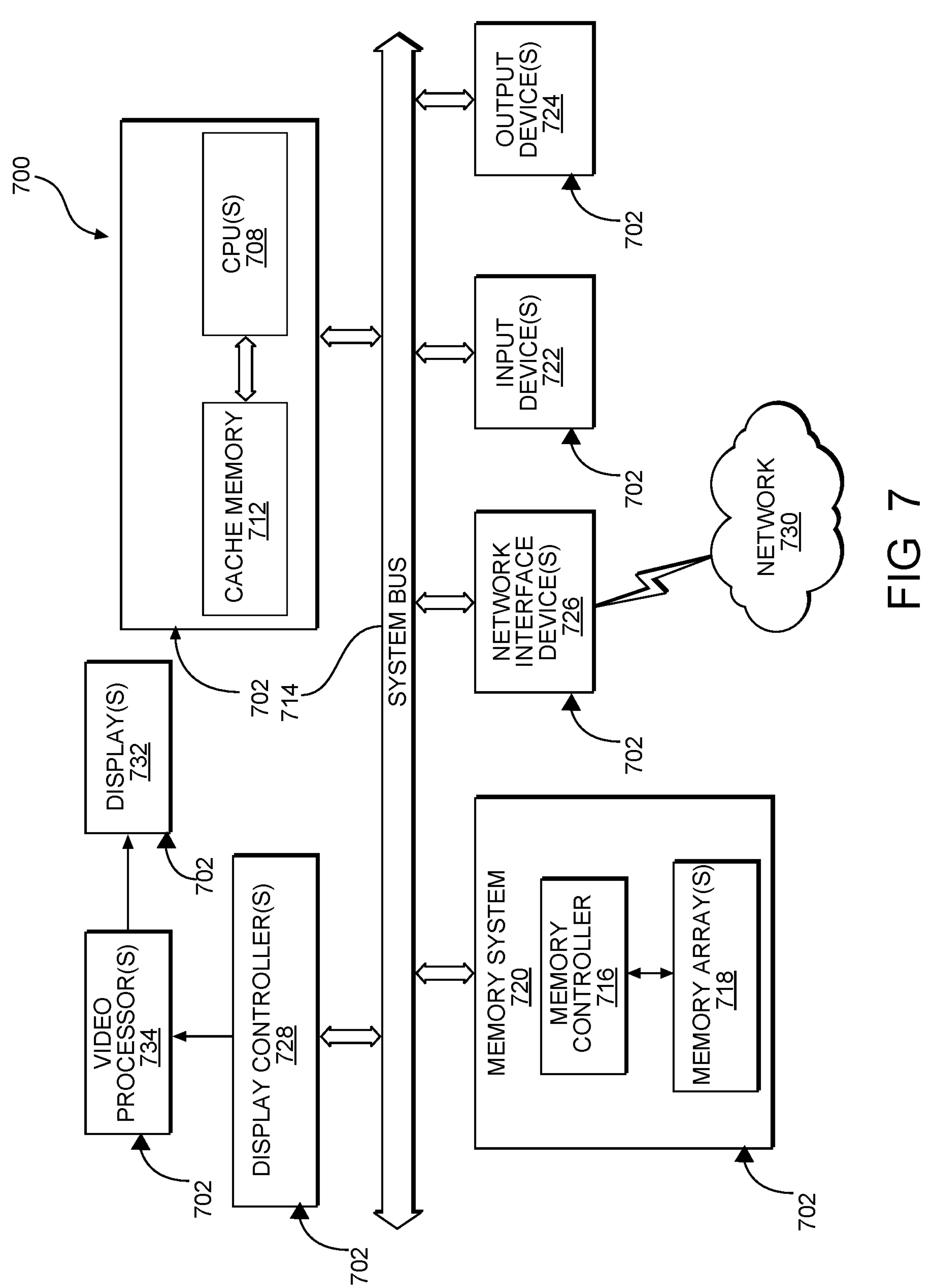
FIG. 7 is a block diagram of an exemplary processor-based system that can include components deployed in an IC package employing a die(s) coupled to a package substrate, wherein the die(s) can include a die interconnect structure with an embedded inductor including coupled coils formed in a RDL and adjacent BDL for improved Q factor, including, but not limited to, the exemplary die interconnect structures in FIGS. 2A-2C and embedded inductors in FIGS. 3A-3H, and according to the exemplary fabrication processes in FIG. 4 and FIGS. 5A-5C.

In this regard, FIG. 7 is a block diagram of an exemplary processor-based system 700 that can include components deployed in an IC package employing a die(s) coupled to a package substrate, wherein the die(s) can include a die interconnect structure with an embedded inductor including coupled coils formed in a RDL and adjacent BDL for improved Q factor, including, but not limited to, the exemplary die interconnect structures in FIGS. 2A-2C and embedded inductors in FIGS. 3A-3H, according to the exemplary fabrication processes in FIG. 4 and FIGS. 5A-5C, and according to any exemplary aspects disclosed herein. In this example, the processor-based system 700 may be formed as an IC package 702 such as the IC package 100 in FIG. 1. The processor-based system 700 includes a central processing unit (CPU) 708 that includes one or more processors 710, which may also be referred to as CPU cores or processor cores. The CPU 708 may have cache memory 712 coupled to the CPU 708 for rapid access to temporarily stored data. The CPU 708 is coupled to a system bus 714 and can intercouple master and slave devices included in the processor-based system 700. As is well known, the CPU 708 communicates with these other devices by exchanging address, control, and data information over the system bus 714. For example, the CPU 708 can communicate bus transaction requests to a memory controller 716, as an example of a slave device. Although not illustrated in FIG. 7, multiple system buses 714 could be provided, wherein each system bus 714 constitutes a different fabric.

Other master and slave devices can be connected to the system bus 714. As illustrated in FIG. 7, these devices can include a memory system 720 that includes the memory controller 716 and a memory array(s) 718, one or more input devices 722, one or more output devices 724, one or more network interface devices 726, and one or more display controllers 728, as examples. Each of the memory system(s) 720, the one or more input devices 722, the one or more output devices 724, the one or more network interface devices 726, and the one or more display controllers 728 can be provided in the same or different electronic devices. The input device(s) 722 can include any type of input device, including, but not limited to, input keys, switches, voice processors, etc. The output device(s) 724 can include any type of output device, including, but not limited to, audio, video, other visual indicators, etc. The network interface device(s) 726 can be any device configured to allow exchange of data to and from a network 730. The network 730 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 726 can be configured to support any type of communications protocol desired.

The CPU 708 may also be configured to access the display controller(s) 728 over the system bus 714 to control information sent to one or more displays 732. The display controller(s) 728 sends information to the display(s) 732 to be displayed via one or more video processor(s) 734, which process the information to be displayed into a format suitable for the display(s) 732. The display controller(s) 728 and video processor(s) 734 can be included as ICs in the same or different electronic devices, and in the same or different electronic devices containing the CPU 708, as an example. The display(s) 732 can include any type of display, including, but not limited to, a cathode ray tube (CRT), a liquid crystal display (LCD), a plasma display, a light emitting diode (LED) display, etc.

Figure 8:
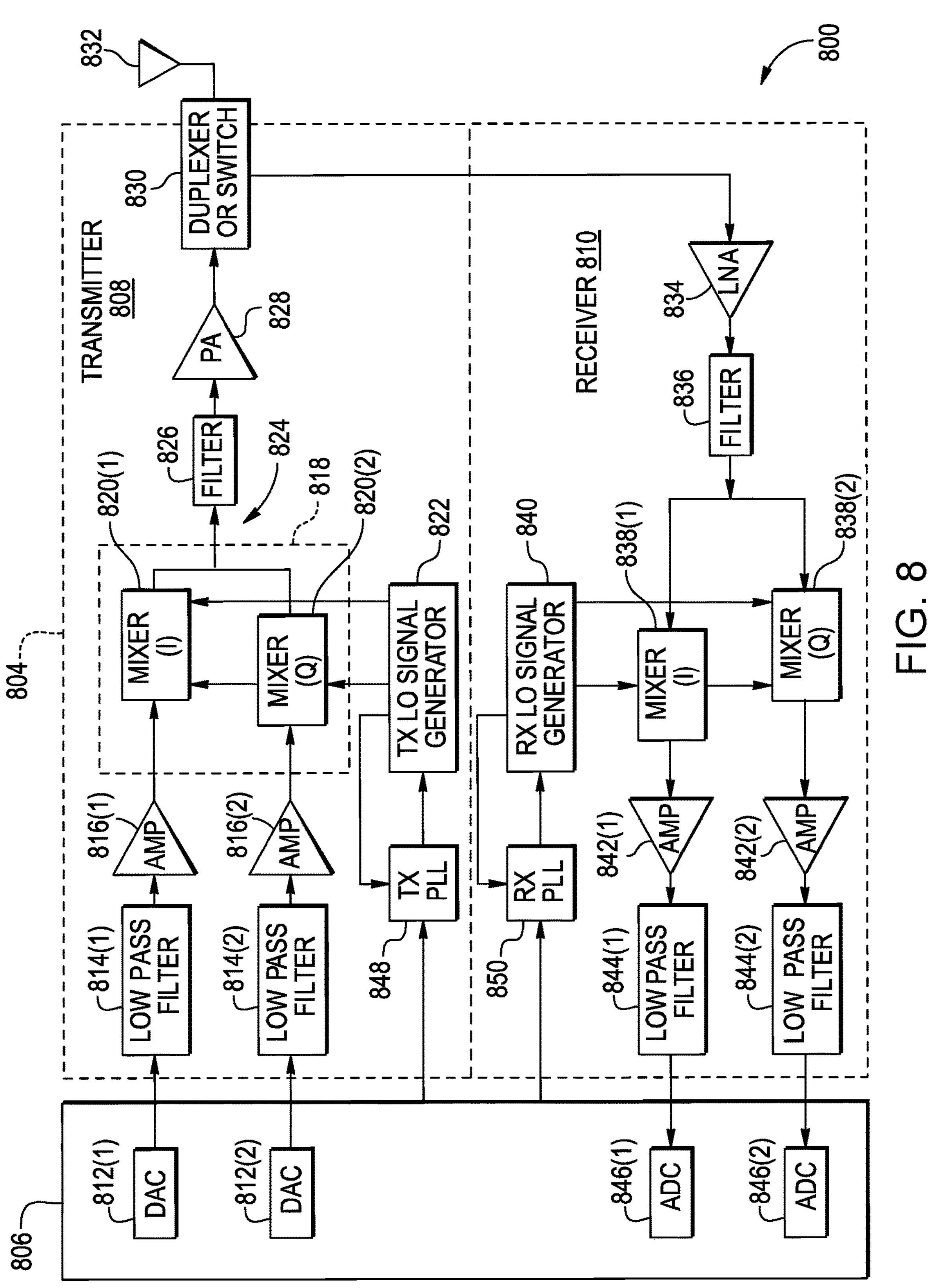
FIG. 8 is a block diagram of an exemplary wireless communications device that includes radio-frequency (RF) components deployed in an IC package, wherein the IC package includes a die interconnect structure with an embedded inductor including coupled coils formed in a RDL and adjacent BDL for improved Q factor, including, but not limited to, the exemplary die interconnect structures in FIGS. 2A-2C and embedded inductors in FIGS. 3A-3H, and according to the exemplary fabrication processes in FIG. 4 and FIGS. 5A-5C.

FIG. 8 is a block diagram of an exemplary wireless communications device that includes radio-frequency (RF) components deployed in an IC package, wherein the IC package, such as the IC package 100, includes a die interconnect structure with an embedded inductor including coupled coils formed in a RDL and adjacent BDL for improved Q factor, including, but not limited to, the exemplary die interconnect structures in FIGS. 2A-2C and embedded inductors in FIGS. 3A-3H, and according to the exemplary fabrication processes in FIG. 4 and FIGS. 5A-5C, and according to any exemplary aspects disclosed herein. The wireless communications device 800 may include or be provided in any of the above-referenced devices, as examples. As shown in FIG. 8, the wireless communications device 800 includes a transceiver 804 and a data processor 806. The data processor 806 may include a memory to store data and program codes. The transceiver 804 includes a transmitter 808 and a receiver 810 that support bi-directional communications. In general, the wireless communications device 800 may include any number of transmitters 808 and/or receivers 810 for any number of communication systems and frequency bands. All or a portion of the transceiver 804 may be implemented on one or more analog ICs, RF ICs (RFICs), mixed-signal ICs, etc.

The transmitter 808 or the receiver 810 may be implemented with a super-heterodyne architecture or a direct-conversion architecture. In the super-heterodyne architecture, a signal is frequency-converted between RF and baseband in multiple stages, for example, from RF to an intermediate frequency (IF) in one stage, and then from IF to baseband in another stage for the receiver 810. In the direct-conversion architecture, a signal is frequency-converted between RF and baseband in one stage. The super-heterodyne and direct-conversion architectures may use different circuit blocks and/or have different requirements. In the wireless communications device 800 in FIG. 8, the transmitter 808 and the receiver 810 are implemented with the direct-conversion architecture.

In the transmit path, the data processor 806 processes data to be transmitted and provides I and Q analog output signals to the transmitter 808. In the exemplary wireless communications device 800, the data processor 806 includes digital-to-analog converters (DACs) 812(1), 812(2) for converting digital signals generated by the data processor 806 into the I and Q analog output signals (e.g., I and Q output currents) for further processing.

Within the transmitter 808, lowpass filters 814(1), 814(2) filter the I and Q analog output signals, respectively, to remove undesired signals caused by the prior digital-to-analog conversion. Amplifiers (AMPs) 816(1), 816(2) amplify the signals from the lowpass filters 814(1), 814(2), respectively, and provide I and Q baseband signals. An upconverter 818 upconverts the I and Q baseband signals with I and Q transmit (TX) local oscillator (LO) signals through mixers 820(1), 820(2) from a TX LO signal generator 822 to provide an upconverted signal 824. A filter 826 filters the upconverted signal 824 to remove undesired signals caused by the frequency up-conversion as well as noise in a receive frequency band. A power amplifier (PA) 828 amplifies the upconverted signal 824 from the filter 826 to obtain the desired output power level and provides a transmit RF signal. The transmit RF signal is routed through a duplexer or switch 830 and transmitted via an antenna 832.

In the receive path, the antenna 832 receives signals transmitted by base stations and provides a received RF signal, which is routed through the duplexer or switch 830 and provided to a low noise amplifier (LNA) 834. The duplexer or switch 830 is designed to operate with a specific receive (RX)-to-TX duplexer frequency separation, such that RX signals are isolated from TX signals. The received RF signal is amplified by the LNA 834 and filtered by a filter 836 to obtain a desired RF input signal. Down-conversion mixers 838(1), 838(2) mix the output of the filter 836 with I and Q RX LO signals (i.e., LO_I and LO_Q) from an RX LO signal generator 840 to generate I and Q baseband signals. The I and Q baseband signals are amplified by AMPs 842(1), 842(2) and further filtered by lowpass filters 844(1), 844(2) to obtain I and Q analog input signals, which are provided to the data processor 806. In this example, the data processor 806 includes analog-to-digital converters (ADCs) 846(1), 846(2) for converting the analog input signals into digital signals to be further processed by the data processor 806.

In the wireless communications device 800 of FIG. 8, the TX LO signal generator 822 generates the I and Q TX LO signals used for frequency up-conversion, while the RX LO signal generator 840 generates the I and Q RX LO signals used for frequency down-conversion. Each LO signal is a periodic signal with a particular fundamental frequency. A TX phase-locked loop (PLL) circuit 848 receives timing information from the data processor 806 and generates a control signal used to adjust the frequency and/or phase of the TX LO signals from the TX LO signal generator 822. Similarly, an RX PLL circuit 850 receives timing information from the data processor 806 and generates a control signal used to adjust the frequency and/or phase of the RX LO signals from the RX LO signal generator 840.

Those of skill in the art will further appreciate that the various illustrative logical blocks, modules, circuits, and algorithms described in connection with the aspects disclosed herein may be implemented as electronic hardware, instructions stored in memory or in another computer readable medium wherein any such instructions are executed by a processor or other processing device, or combinations of both. The devices and components described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. A die interconnect structure formed on a die comprising a first surface, the die interconnect structure comprising:
   - a redistribution layer (RDL) extending in a first direction adjacent to the first surface and having a second surface, the RDL comprising:
     - a first coil extending in the first direction;
   - a bump-level distribution layer (BDL) extending in the first direction, the BDL comprising:
     - a second coil;
   - a seed layer extending in the first direction adjacent to the second surface of the RDL, the seed layer between the first coil and the second coil; and
   - an inductor, comprising:
     - the first coil;
     - the second coil; and
     - a via extending in a second direction orthogonal to the first direction, the via coupling the first coil to the second coil.
2. The die interconnect structure of clause 1, wherein the first coil and the second coil are parallel, wherein the first coil and the second coil have a same polygon shape.
3. The die interconnect structure of clause 1 or 2, wherein the first coil and the second coil are coextensive.
4. The die interconnect structure of any of clauses 1-3, wherein the same polygon shape is selected from the group consisting of a triangle, a quadrilateral, a hexagon, and an octagon.
5. The die interconnect structure of any of clauses 1-4, wherein the first coil has a third surface opposite the second surface, the inductor further comprising:
   - a first metallization layer extending in the first direction and adjacent to the third surface, the first metallization layer comprising:
     - a third coil parallel to the first coil.
6. The die interconnect structure of clause 5, wherein the third coil has a fourth surface, the inductor further comprising:
   - a second metallization layer extending in the first direction and adjacent to the fourth surface, the second metallization layer comprising:
     - a fourth coil parallel to the third coil.
7. The die interconnect structure of any of clauses 1-6, wherein:
   - the RDL further comprises:
     - a metal pad; and
   - the BDL further comprises:
     - a secondary metal pad, wherein the seed layer is between the secondary metal pad and the metal pad.

8. The die interconnect structure of any of clauses 1-7, wherein the second coil encompasses an area of approximately 100 square micrometers ($\mu m^2$).
9. The die interconnect structure of any of clauses 1, 2, and 4-8, wherein the first coil and the second coil are coincident.
10. The die interconnect structure of any of clauses 1, 2, and 4-8, wherein the second coil has a second perimeter overlaps a first perimeter of the first coil.
11. The die interconnect structure any of clauses 1-10 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; and a multicopter.
12. A method for forming a die interconnect structure formed on a die comprising a first surface, the method comprising:
    depositing a redistribution layer (RDL) extending in a first direction adjacent to the first surface and having a second surface, comprising:
        forming a first coil extending in the first direction;
    depositing a seed layer extending in the first direction adjacent to the second surface of the RDL;
    depositing a bump-level distribution layer (BDL) extending in the first direction, comprising:
        forming a second coil, the seed layer between the first coil and the second coil; and
    forming an inductor, comprising:
        forming a via extending in a second direction orthogonal to the first direction, the via coupling the first coil to the second coil.
13. The method of clause 12, wherein the first coil and the second coil are parallel, wherein the first coil and the second coil have a same polygon shape.
14. The method of clause 12 or 13, wherein the first coil and the second coil are coextensive.
15. The method of any of clauses 12-14, wherein the same polygon shape is selected from the group consisting of a triangle, a quadrilateral, a hexagon, and an octagon.
16. The method of any of clauses 12-15, wherein the first coil has a third surface opposite the second surface, the method further comprising: depositing a first metallization layer extending in the first direction and adjacent to the third surface, the first metallization layer comprising: a third coil parallel to the first coil.
17. The method of clause 16, wherein the third coil has a fourth surface, the method further comprising:
    depositing a second metallization layer extending in the first direction and adjacent to the fourth surface, the second metallization layer comprising:
        a fourth coil parallel to the third coil.
18. The method of any of clauses 12-17, wherein:
    depositing the RDL further comprises:
        forming a metal pad; and
    depositing the BDL further comprises:
        forming a secondary metal pad, wherein the seed layer is between the secondary metal pad and the metal pad.
19. The method of any of clauses 12-18, wherein the second coil encompasses an area of approximately 100 square micrometers ($\mu m^2$).
20. The method of any of clauses 12, 13, and 15-19, wherein the second coil overlaps the first coil.

What is claimed is:

1. A die interconnect structure formed on a die comprising a first surface, the die interconnect structure comprising:
a redistribution layer (RDL) extending in a first direction adjacent to the first surface and having a second surface, the RDL comprising:
a first coil extending in the first direction;
a bump-level distribution layer (BDL) extending in the first direction, the BDL comprising:
a second coil;
a seed layer extending in the first direction adjacent to the second surface of the RDL, the seed layer between the first coil and the second coil; and
an inductor, comprising:
the first coil;
the second coil; and
a via extending in a second direction orthogonal to the first direction, the via coupling the first coil to the second coil.

2. The die interconnect structure of claim 1, wherein the first coil and the second coil are parallel, wherein the first coil and the second coil have a same polygon shape.

3. The die interconnect structure of claim 1, wherein the first coil and the second coil are coextensive.

4. The die interconnect structure of claim 2, wherein the same polygon shape is selected from the group consisting of a triangle, a quadrilateral, a hexagon, and an octagon.

5. The die interconnect structure of claim 1, wherein the first coil has a third surface opposite the second surface, the inductor further comprising:
a first metallization layer extending in the first direction and adjacent to the third surface, the first metallization layer comprising:
a third coil parallel to the first coil.

6. The die interconnect structure of claim 5, wherein the third coil has a fourth surface, the inductor further comprising:
a second metallization layer extending in the first direction and adjacent to the fourth surface, the second metallization layer comprising:
a fourth coil parallel to the third coil.

7. The die interconnect structure of claim 1, wherein:
the RDL further comprises:
a metal pad; and
the BDL further comprises:
a secondary metal pad, wherein the seed layer is between the secondary metal pad and the metal pad.

8. The die interconnect structure of claim 1, wherein the second coil encompasses an area of approximately 100 square micrometers ($\mu m^2$).

9. The die interconnect structure of claim 1, wherein the first coil and the second coil are coincident.

10. The die interconnect structure of claim 1, wherein the second coil has a second perimeter overlaps a first perimeter of the first coil.

11. The die interconnect structure claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; and a multicopter.

12. A method for forming a die interconnect structure formed on a die comprising a first surface, the method comprising:

depositing a redistribution layer (RDL) extending in a first direction adjacent to the first surface and having a second surface, comprising:

forming a first coil extending in the first direction;

depositing a seed layer extending in the first direction adjacent to the second surface of the RDL;

depositing a bump-level distribution layer (BDL) extending in the first direction, comprising:

forming a second coil, the seed layer between the first coil and the second coil; and forming an inductor, comprising:

forming a via extending in a second direction orthogonal to the first direction, the via coupling the first coil to the second coil.

13. The method of claim 12, wherein the first coil and the second coil are parallel, wherein the first coil and the second coil have a same polygon shape.

14. The method of claim 12, wherein the first coil and the second coil are coextensive.

15. The method of claim 13, wherein the same polygon shape is selected from the group consisting of a triangle, a quadrilateral, a hexagon, and an octagon.

16. The method of claim 12, wherein the first coil has a third surface opposite the second surface, the method further comprising:

depositing a first metallization layer extending in the first direction and adjacent to the third surface, the first metallization layer comprising:

a third coil parallel to the first coil.

17. The method of claim 16, wherein the third coil has a fourth surface, the method further comprising:

depositing a second metallization layer extending in the first direction and adjacent to the fourth surface, the second metallization layer comprising:

a fourth coil parallel to the third coil.

18. The method of claim 12, wherein:

depositing the RDL further comprises:

forming a metal pad; and depositing the BDL further comprises:

forming a secondary metal pad, wherein the seed layer is between the secondary metal pad and the metal pad.

19. The method of claim 12, wherein the second coil encompasses an area of approximately 100 square micrometers ($\mu m^2$).

20. The method of claim 12, wherein the second coil overlaps the first coil.

* * * * *